(12) United States Patent
Arent et al.

(10) Patent No.: US 11,365,379 B2
(45) Date of Patent: Jun. 21, 2022

(54) PHOTORESIST REMOVER COMPOSITIONS

(71) Applicant: Merck Patent GmbH, Darmstadt (DE)

(72) Inventors: Robert Arent, Clinton, NJ (US);
Hengpeng Wu, Hillsborough, NJ (US);
Guanyang Lin, Whitehouse Station, NJ (US)

( * ) Notice: Subject to any disclaimer, the term of this patent is extended or adjusted under 35 U.S.C. 154(b) by 0 days.

(21) Appl. No.: 16/961,821

(22) PCT Filed: Jan. 23, 2019

(86) PCT No.: PCT/EP2019/051534
§ 371 (c)(1),
(2) Date: Jul. 13, 2020

(87) PCT Pub. No.: WO2019/145312
PCT Pub. Date: Aug. 1, 2019

(65) Prior Publication Data
US 2021/0115362 A1    Apr. 22, 2021

Related U.S. Application Data

(60) Provisional application No. 62/621,760, filed on Jan. 25, 2018.

(51) Int. Cl.
*C11D 3/34* (2006.01)
*C11D 11/00* (2006.01)
(Continued)

(52) U.S. Cl.
CPC ............ *C11D 11/0047* (2013.01); *B08B 3/08* (2013.01); *B08B 3/10* (2013.01); *C11D 1/721* (2013.01);
(Continued)

(58) Field of Classification Search
CPC ................................................. C11D 11/0047
(Continued)

(56) References Cited

U.S. PATENT DOCUMENTS 5,885,901 A   3/1999  Gotoh et al.
5,972,862 A   10/1999 Torii et al.
(Continued)

FOREIGN PATENT DOCUMENTS

EP   0 939 344 A1   9/1999
EP   1 635 224 A2   3/2006
(Continued)

OTHER PUBLICATIONS

International Search Report and Opinion, PCT/EP2019/051534, dated Mar. 27, 2019.
(Continued)

*Primary Examiner* — Gregory E Webb

(57) ABSTRACT

The present invention relates to a composition consisting essentially of a sulfonic acid component selected from the group consisting of camphor sulfonic acid, and a benzene sulfonic acid of structure (I), wherein R is H or a C-1 to C-18 n-alkyl, oxalic acid, a solvent component which consists essentially of an organic solvent component, or a mixture of an organic solvent components and water, wherein the organic solvent component consist of about 100 wt % to about 85 wt % of said solvent component, and further wherein said organic solvent component is either selected from solvent (III), (IV), (V), (VI) (wherein R is selected from the group consisting of $-(-O-CH_2-CH_2-)_n$, $-OH$, $-OH$, and $-O-C(=O)-CH_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least two organic solvents selected from this group. The invention also relates to such compositions also containing a surfactant component, and also pertains to the process of using either of these compositions as a resist remover.

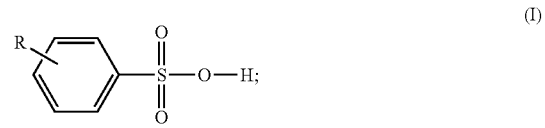

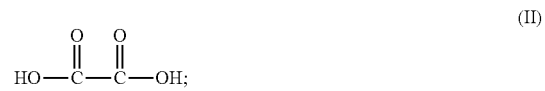

Dipropylene glycol monomethyl ether (III),

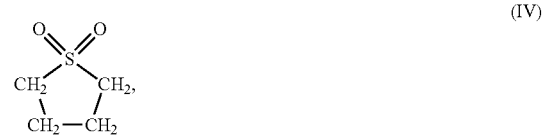

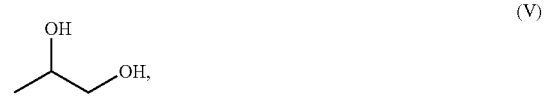

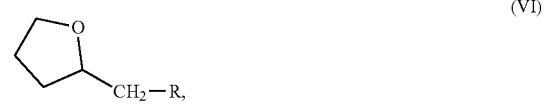

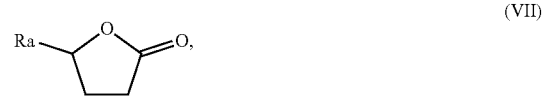

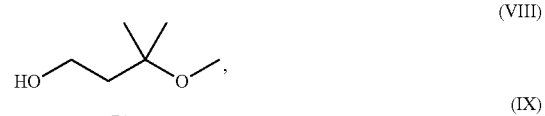

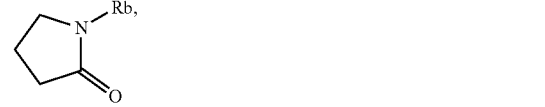

(Continued)

-continued

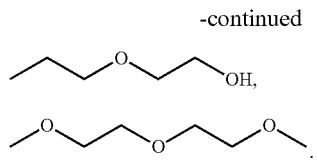

26 Claims, No Drawings

(51) Int. Cl.
- B08B 3/08 (2006.01)
- B08B 3/10 (2006.01)
- C11D 1/72 (2006.01)
- C11D 3/20 (2006.01)
- C11D 3/43 (2006.01)
- G03F 7/42 (2006.01)

(52) U.S. Cl.
CPC .......... C11D 3/2068 (2013.01); C11D 3/2082 (2013.01); C11D 3/3454 (2013.01); C11D 3/43 (2013.01); G03F 7/426 (2013.01); B08B 2203/007 (2013.01)

(58) Field of Classification Search
USPC ........................................................ 510/175
See application file for complete search history.

(56) References Cited

U.S. PATENT DOCUMENTS

| | | | |
|---|---|---|---|
| 6,551,973 B1 | 4/2003 | Moore et al. | |
| 6,864,044 B2 | 3/2005 | Ishikawa et al. | |
| 7,087,561 B2 | 8/2006 | Yates et al. | |
| 10,613,442 B2 | 4/2020 | Moore | |
| 2006/0046944 A1 | 3/2006 | Hata et al. | |
| 2006/0293208 A1* | 12/2006 | Egbe | G03F 7/425 510/407 |
| 2009/0131295 A1 | 5/2009 | Cui | |
| 2010/0043823 A1* | 2/2010 | Lee | H01L 21/31111 134/1.3 |
| 2010/0112728 A1 | 5/2010 | Korzenski et al. | |
| 2012/0028870 A1* | 2/2012 | Barnes | C11D 3/2096 510/175 |
| 2012/0073610 A1* | 3/2012 | Kamimura | H01L 21/02071 134/26 |
| 2013/0225464 A1* | 8/2013 | Harada | C11D 11/0047 510/175 |
| 2013/0261039 A1 | 10/2013 | Little | |
| 2014/0038420 A1 | 2/2014 | Chen et al. | |
| 2015/0027978 A1* | 1/2015 | Barnes | C09K 13/06 216/13 |
| 2016/0020087 A1* | 1/2016 | Liu | C11D 3/2075 510/175 |
| 2016/0075971 A1* | 3/2016 | Liu | C23G 1/18 510/175 |
| 2016/0130500 A1* | 5/2016 | Chen | C11D 3/044 216/13 |
| 2017/0200601 A1* | 7/2017 | Song | C11D 3/042 |
| 2017/0200619 A1* | 7/2017 | Cooper | C11D 7/22 |
| 2017/0330763 A1* | 11/2017 | Kamei | C09G 1/02 |
| 2018/0074408 A1* | 3/2018 | Moore | C11D 11/0047 |
| 2018/0100128 A1* | 4/2018 | Park | C11D 7/34 |
| 2018/0230405 A1* | 8/2018 | Kneer | C11D 3/43 |
| 2018/0272386 A1* | 9/2018 | McAlpin | C11D 7/263 |
| 2019/0016999 A1* | 1/2019 | Sakamuri | C11D 3/0073 |

FOREIGN PATENT DOCUMENTS

| | | |
|---|---|---|
| EP | 1 860 508 A2 | 11/2007 |
| EP | 1 975 987 A2 | 10/2008 |
| FR | 2 455 076 | 11/1980 |
| JP | H2-251855 A | 10/1990 |
| JP | H10-55993 A | 2/1998 |
| JP | 2006011433 A | 1/2006 |
| JP | 2010002580 A | 1/2010 |
| KR | 2016 0091615 A | 8/2016 |
| TW | 2016-41685 A | 12/2016 |
| WO | 98 00244 A1 | 1/1998 |
| WO | 02/059244 A2 | 8/2002 |
| WO | 2009/058278 A1 | 5/2009 |
| WO | 2010/039936 A2 | 4/2010 |
| WO | 2012/154498 A2 | 9/2012 |
| WO | 2012 168485 A1 | 12/2012 |
| WO | 2016/142507 A1 | 9/2016 |
| WO | 2016 142507 A1 | 9/2016 |
| WO | 2016142507 A1 | 9/2016 |
| WO | 2019 145312 A1 | 8/2019 |

OTHER PUBLICATIONS

English translation of Office Action issued in JP Application No. 2020-539825.
English translation of Office Action issued in TW Application No. 108102463.
English Abstract of JP2010-002580A, dated Jan. 7, 2010.
English Abstract of JP2006-011433, dated Jan. 7, 2010.
English Abstract of JPH2-251855, dated Oct. 9, 1990.

* cited by examiner

PHOTORESIST REMOVER COMPOSITIONS

This application is a United States National Stage Patent Application under 35 U.S.C. § 371 of International Patent Application No. PCT/EP2019/051534, filed Jan. 23, 2019, which claims priority to U.S. Provisional Patent Application No. 62/621,760, filed Jan. 25, 2018, the contents of each of which are being hereby incorporated herein by reference.

FIELD OF INVENTION

The present invention relates to compositions of a low pKa remover solution consisting of specific sulfonic acids, oxalic acid, and a solvent component consisting of specific organic solvents, mixtures of these, or mixture of these organic solvent and mixtures of organic solvents with water. The invention also relates to remover solutions, which in additional to the above components, also contain a surfactant component. These remover solutions show clean removal of photoresist patterns from substrates, showing complete dissolution of the removed resist pattern with no particle formation or deposition. Further, when the substrate is a metal such as copper, additionally, the removal of the patterned resist does not cause any significant corrosion of the metal substrate.

BACKGROUND

This invention relates to a chemical stripper composition that removes cross-linked polymer coatings using novel remover compositions which do not promote significant corrosion of metal substrates, but which unexpectedly also do not require the presence of metal protecting Rosin compounds modified by an unsaturated anhydride (e.g. fumaric acid) or polymers of charge complexing character to prevent corrosion.

Materials removed by these novel formulations include positive tone and negative-tone chemically amplified (e.g. epoxy) and acid-catalyzed photoimageable coatings. Many commercialized strippers for microelectronic coatings do not perform sufficiently to meet minimum manufacturing requirements. The invention provides a commercial framework to create removal products for cross-linked systems that respond in acidic media without the harmful etching and damaging effects commonly observed on devices that contain metals such as copper, but at the same time do not contain metal protecting Rosins modified by an unsaturated anhydride (e.g. fumaric acid) or polymers of charge complexing that may deleteriously form particulate matter during the removing/stripping process.

For various processed conditions, up to and including hard-baking, or otherwise referred to as full-cure, the composition will remove and dissolve chemically-amplified reacted compounds within minutes without damaging effects to sensitive metals such as copper, using conventional immersion conditions at elevated temperatures. Such full-cure coatings are found to be resistant to conventional organic strippers that commonly comprise alkaline ingredients as exemplified in U.S. Pat. No. 6,551,973 (2003), Moore et al. Using these conventional strippers, no dissolution occurs. Instead, these conventional alkaline strippers are observed to remove the coating by mechanisms of lifting or breaking-up into pieces. This lift-off mechanism generates incomplete removal from complex three dimensional topographies as commonly seen in microelectromechanical systems (MEMS) devices. Un-dissolved material will produce particles that are circulated throughout the bath, causing re-deposition of the un-dissolved pieces onto other areas of the device. Such contamination that occurs onto these tiny, computer controlled, gears, sensors, springs, pumps, and related micro or nano-scale fixtures results in contamination and device failure. It is an object of this invention to achieve full-dissolving of the unwanted polymer material during the given stripping and removal period.

Some low pKa systems that remove crosslinked coatings, do so by complete dissolution, rather than lift-off, however, these remover materials may contain polymers of charge complexing character, or Rosins modified by an unsaturated anhydride (e.g fumarated Rosins) (metal protecting Rosins) to prevent significant corrosion. The addition of these types of compounds, unexpectedly, causes a particulate problem, due to their precipitation during the removal of resist substrates from a substrate. The particles formed by these types of compounds, in low pKa removers, deposit unto other areas of the device, deleteriously affecting the performance of the final device. A non-limiting example of such low pKa remover systems containing such Fumarate Rosin compounds is described in WO2016/142507.

During the manufacture of these microcircuits or microdevices, various inorganic substrates such as single and polycrystalline silicon, hybrid semiconductors such as gallium arsenide, and metals, are coated with an organic coating ("photoresist", or resist) which forms a resistant framework of permanent or temporary design and exhibits a pattern after undergoing a photolithographic process. The photoresist may be utilized to insulate conductors or protect selected areas of the substrate surface, such as silicon, silicon dioxide, or aluminum, from the action of chemicals in both wet (chemical) and dry (plasma) forms. In the case of the material being utilized as a photoresist, exposed areas of the substrate may carry out a desired etch (removal) or deposition (addition) process. Following completion of this operation and after subsequent rinsing or conditioning, it is necessary that the resist and any application post-etch residue be removed to permit essential finishing operations. Upon removal of the photoresist, specific micro-etched or deposited patterns are left behind. The masking and patterning processes are repeated several times to produce layered arrangements that comprise the art of the final device. Each step requires complete resist stripping and dissolving, to ensure that the final form device is produced at relatively high yields and performs satisfactorily. The deposition of any particles during this process into active area deleteriously affects both the yield and performance of devices.

It is an object of this invention to provide an improved stripping composition that will remove a wide range of different pattered photoresist film including, ones formed from different types of both negative and positive resist systems. Of these different types, examples are resists which are imagable by visible light, broadband i-line, g-line, h-line, UV, 248 nm, 193 nm, 193 nm immersion, deep UV, EUV, electron or e-beam. Depending of which type is employed these materials may contain additives such as photo-active compounds (e.g. DNQ), photo-acid generators (PAG), and photoradical generators which may be prone to particle formation. Consequently, it is also an objective that our invention be able to remove patterns formed from these types of resist, giving complete dissolution in minutes, rather than hours of all components, resins and additives, without particle formation. It is also an object of this invention to conduct such photoresist removal from substrates without attack to underlying exposed copper as well as other metals without the use polymers of charge complexing character, or metal protecting Rosins modified by an unsaturated anhydride (e.g fumarated Rosins), as compounds to prevent significant corrosion. This is because these types of additives, promote particle formation during the removal of the resist pattern from a substrate. It is a further object to conduct this photoresist pattern removal and metal protection by utilizing a safe and non-regulated chemistry that does not produce harm to workers or to the environment and avoiding the use of organic solvents with low flash point, especially those whose boiling points are below about 150° C.

The current novel remover compositions, impart these advantageous properties by completely dissolving the photoresist pattern, from patterns from many different types of resist, not forming lifted-off resist film, or particles resulting from either resins or additives using safe non-regulated organic solvents whose boiling points is above 150° C. At the same time, unexpectedly, these novel remover composition, while containing a low pKa component, select sulfonic acid components, oxalic acid, and an organic solvent component consisting of select organic solvent components and water do not require the presence of polymers of charge complexing character, or metal protecting Rosins, which are Rosins modified by an unsaturated anhydride (e.g fumarated Rosin compounds), prevent significant corrosion of metal substrate such as copper and the like. Consequently, there is no problem associated with the precipitation of metal protecting Rosin type compounds or Polymers of change complexing character during the removal process using these novel remover compositions. These novel remover compositions and process of use thereof have been found to be especially useful in the manufacture of semiconductor wafers, MEMS devices, and displays.

SUMMARY OF THE INVENTION

In one of its aspects, the present invention relates to a composition consisting essentially of a sulfonic acid component selected from the group consisting of camphor sulfonic acid, and a benzene sulfonic acid of structure (I), wherein R is H or a C-1 to C-18 n-alkyl;

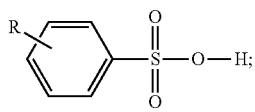
(I)

and a dicarboxylic acid having structure (II),

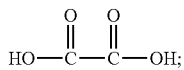
(II)

a solvent component which consists essentially of a first component which is an organic solvent component and a second component which is water, wherein the organic solvent component consist of about 95 wt % to about 85 wt % of said solvent component, and further wherein said organic solvent component is either selected from the group consisting of organic solvents (III), (IV), (V), (VI) (wherein R is selected from the group consisting of —(—O—CH$_2$—CH$_2$—)$_{n'}$—OH, —OH, and —O—C(=O)—CH$_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least two organic solvents selected from this group;

Dipropylene glycol monomethyl ether (III),

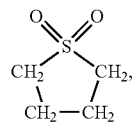
(IV)

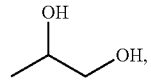
(V)

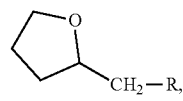
(VI)

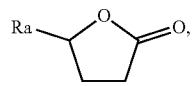
(VII)

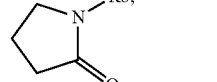
(VIII)

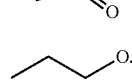
(IX)

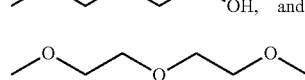
(X)

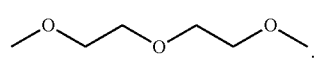
(XI)

In another embodiment, this composition also, additionally, consist essentially of, a surfactant component.

Finally, this invention also relates to using either above compositions to remove a patterned photoresist from a substrate.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The term (meth)acrylate is a term which embodies in one term both acrylate and methacrylate.

The term "stripper," and "remover," are synonymous.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Unless otherwise specified, the term "metal protecting Rosins," refers to Rosin compounds which have been treated with an unsaturated cyclic dicarboxylate anhydride. A non-limiting example of this are Rosin compounds which have been treated with fumarate anhydride.

When referring to the novel compositions, as a whole, in terms of wt % it is understood that in no event shall the wt % of all components, including non-essential components, such as impurities, add to more than 100 wt %. The composition of all essential components may add up to less than 100 wt % in those instances wherein the composition contains some small amount of a non-essential contaminants or impurities. Otherwise, if no significant non-essential impurity component is present, it is understood that the composition of all essential components will essentially add up to 100 wt %. Similarly, when referring to the wt % of components in the solvent component of the novel composition, it is understood that the sum of wt % of the water component and the select organic solvent component shall add up, essentially, up to 100 wt % if no impurities are present. Here again, it is possible that the composition of all the essential components of the solvent component, namely water and the select organic solvent component may add up to less than 100 wt % in those instances wherein the solvent component composition contains some small amount of a non-essential contaminants or impurities.

The present invention relates to composition comprising or consisting essentially of or consisting of a sulfonic acid component selected from the group consisting of camphor sulfonic acid, and a benzene sulfonic acid of structure (I), wherein R is H or a C-1 to C-18 n-alkyl;

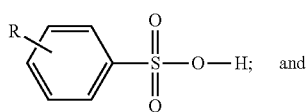
(I)

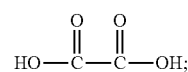
(II)

a solvent component which consists essentially of an organic solvent component, or a mixture of an organic solvent component and water, wherein the organic solvent component consist of about 100 wt % to about 85 wt % of said solvent component, and further wherein said organic solvent component is either selected from the group consisting of solvents (III), (IV), (V), (VI) (wherein R is selected from the group consisting of —(—O—CH$_2$—CH$_2$—)$_{n'}$—OH, —OH, and —O—C(=O)—CH$_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least two compounds selected from this group;

Dipropylene glycol monomethyl ether (III),

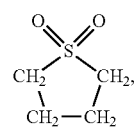
(IV)

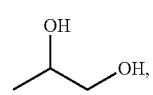
(V)

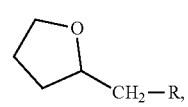
(VI)

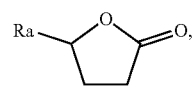
(VII)

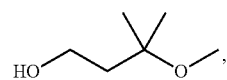
(VIII)

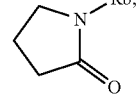
(IX)

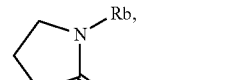

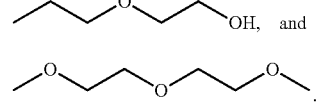
(X)

(XI)

The present invention relates to composition comprising, consisting essentially or consisting of a sulfonic acid component selected from the group consisting of camphor sulfonic acid, and a benzene sulfonic acid of structure (I), wherein R is H or a C-1 to C-18 n-alkyl;

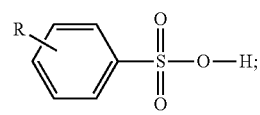
(I)

and
a dicarboxylic acid having structure (II);

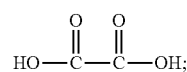
(II)

a solvent component which comprises or consists essentially of or consists of an organic solvent component, or a mixture of an organic solvent component and water, wherein the organic solvent component consist of about 100 wt % to about 85 wt % of said solvent component, and further wherein said organic solvent component is either selected from the group consisting of organic solvents (III), (IV), (V), (VI) (wherein R is selected from the group consisting of —(—O—CH$_2$—CH$_2$—)$_{n'}$—OH, —OH, and —O—C(=O)—CH$_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least two organic solvents selected from this group;

Dipropylene glycol monomethyl ether (III),

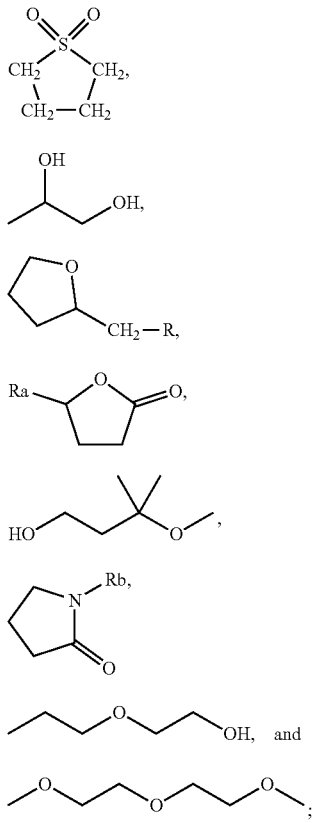

and a surfactant.

In the above embodiments, Dipropylene glycol monomethyl ether (III) (DPGME) is a mixture of isomeric compounds which has CAS #34590-94-8. This mixture has general formula is (CH$_3$O)C$_3$H$_6$OC$_3$H$_6$(OH). This mixture also has the synonymous name Dipropylene glycol methyl ether. Dipropylene glycol monomethyl ether, comprises the following isomeric compounds: 1-(2-methoxypropoxy)-2-propanol (CAS 13429-07-7) (IIIa); 1-(2-methoxy-1-methylethoxy)-2-propanol (CAS 20324-32-7)(IIIb), 2-(2-methoxypropoxy)-1-propanol (CAS 13588-28-8)(IIIc); 2-(2-(2-methoxypropoxy)-1-propanol (CAS 55956-21-3) (IIId), having the following structures:

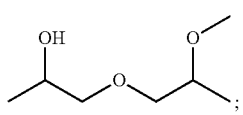

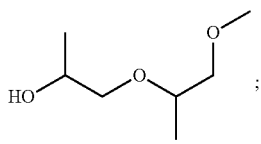

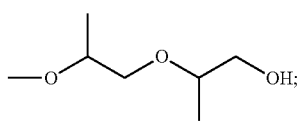

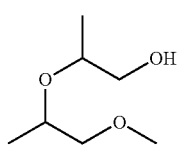

In the above embodiments containing surfactant, there is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.).

In another embodiment of the aforementioned inventive compositions, is wherein, the surfactant is present in an amount that is less than 1 wt % of the total weight of the composition. In another embodiment, the surfactant is present in an amount that is less than 0.1 wt %.

In another embodiment of the aforementioned inventive compositions, the surfactant is a polymeric surfactant having structure (XII), wherein n''' is the number of polymer repeat unit and na is the number of CH$_2$ spacer moieties, which is an integer from 8 to 14.

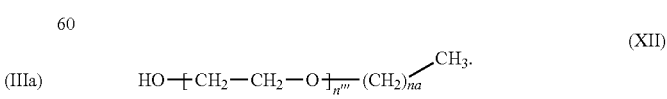

In another embodiment of the aforementioned inventive compositions, the surfactant is a polymeric surfactant having structure (XII), surfactant has structure (XIIa).

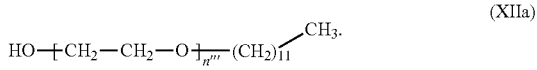

(XIIa)

In another embodiment of the aforementioned inventive compositions, the surfactant is one having structure (XIV).

(XIII)

In embodiments of this invention containing a surfactant having structure (XII) it may be present in the composition from about 0.005 wt % to about 3 wt %. In another embodiment from about 0.01 wt % to about 2.5 wt %. In another embodiment from about 0.1 wt % to about 2.5 wt %. In another embodiment from about 0.5 wt % to about 2.5 wt %. In yet another embodiment from about 1 wt % to about 2.5 wt %. In still another embodiment from about 1.5 wt % to about 2.5 wt %. In yet another embodiment from about 1.75 wt % to about 2.5 wt %. In still another embodiment from about 1.75 wt % to about 2.2 wt %. In yet another embodiment from about 1.8 wt % to about 2.1 wt %. In yet another embodiment from about 1.85 wt % to about 2.1 wt %. about 1.9 wt % to about 2.0 wt %. In still another embodiment about 2 wt %.

In embodiments of this invention containing a surfactant having structure (XIIa) it may be present in the composition from about 0.005 wt % to about 3 wt %. In another embodiment from about 0.01 wt % to about 2.5 wt %. In another embodiment from about 0.1 wt % to about 2.5 wt %. In another embodiment from about 0.5 wt % to about 2.5 wt %. In yet another embodiment from about 1 wt % to about 2.5 wt %. In still another embodiment from about 1.5 wt % to about 2.5 wt %. In yet another embodiment from about 1.75 wt % to about 2.5 wt %. In still another embodiment from about 1.75 wt % to about 2.2 wt %. In yet another embodiment from about 1.8 wt % to about 2.1 wt %. In yet another embodiment from about 1.85 wt % to about 2.1 wt %. about 1.9 wt % to about 2.0 wt %. In still another embodiment about 2 wt %.

In embodiments of this invention containing a surfactant having structure (XIII) it may be present in the composition from about 0.005 wt % to about 3 wt %. In another embodiment from about 0.01 wt % to about 2.5 wt %. In another embodiment from about 0.1 wt % to about 2.5 wt %. In another embodiment from about 0.5 wt % to about 2.5 wt %. In yet another embodiment from about 1 wt % to about 2.5 wt %. In still another embodiment from about 1.5 wt % to about 2.5 wt %. In yet another embodiment from about 1.75 wt % to about 2.5 wt %. In still another embodiment from about 1.75 wt % to about 2.2 wt %. In yet another embodiment from about 1.8 wt % to about 2.1 wt %. In yet another embodiment from about 1.85 wt % to about 2.1 wt %. about 1.9 wt % to about 2.0 wt %. In still another embodiment about 2 wt %.

For said sulfonic acid component in the novel composition, this component may be present from about 0.1 wt % to about 10 wt % of the total wt of the composition. In another embodiment these may be present from about 0.5 wt % to about 2.5 wt %.

In one embodiment of the above described novel compositions, said sulfonic acid component is camphor sulfonic acid.

In another embodiment of the above described novel compositions, said sulfonic acid component is benzenesulfonic acid.

In another embodiment of the above described novel compositions, said sulfonic acid component is toluene sulfonic acid.

In another embodiment of the above described novel compositions, said sulfonic acid component is a benzene sulfonic acid of structure (Ia), wherein said sulfonic acid component is an alkyl benzene sulfonic acid of structure (Ia), wherein n is an integer from 0 to 16.

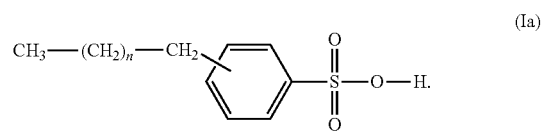

(Ia)

In another embodiment of the above described novel compositions, said sulfonic acid component is a benzene sulfonic acid of structure (Ia), in which n is an integer from 8 to 16.

In another embodiment of the above described novel compositions, said sulfonic acid component is a benzene sulfonic acid of structure (Ia), in which n is an integer from 8 to 14.

In another embodiment of the above described novel compositions, said sulfonic acid component is a benzene sulfonic acid of structure (Ia), in which n is an integer from 8 to 10.

In another embodiment of the above described novel compositions, said sulfonic acid component is a benzene sulfonic acid of structure (Ia), in which n is an integer from 8 to 16. In another aspect of this embodiment the composition is one wherein for said alkylbenzenesulfonic acid n is an integer from 8 to 14. In yet another embodiment of this aspect, the alkylbenzenesulfonic acid is one wherein n is an integer from 8 to 10.

In another embodiment of any of the above aspects of this composition, in which the sulfonic acid is one having structure (Ia), this sulfonic acid has a wt % loading in the total wt of the solution ranging from about 0.1 wt % to about 10 wt %. In another aspect of this embodiment the wt % loading of this acid is from about 0.5 wt % to about 8 wt %. In another aspect of this embodiment the wt % loading of this acid is from about 0.5 wt % to about 6 wt %. In another aspect of this embodiment the wt % is from about 0.5 wt % to about 4 wt %. %. In another aspect of this embodiment the wt % is from about 0.5 wt % to about 3 wt %. In another aspect of this embodiment the wt % is from about 0.5 wt % to about 2.5 wt %. In another aspect of this embodiment the wt % is about 5 wt %. In another aspect of any of the above composition ranges, the alkenesulfonic acid is one having structure (Ia) wherein, n is an integer from 8 to 16. In another aspect n is an integer from 8 to 14. In yet another aspect, n is an integer from 8 to 10. In yet another aspect of this embodiment n is an integer from 8 to 10. In yet another embodiment of this embodiment is one wherein the alkylbenzensulfonic acid has structure (1b).

In another embodiment of the any of the above aspect of this composition, wherein the alkylbenzensulfonic acid has the more specific structure (Ia), in a more specific embodiment, n is an integer from 0 to 10. In still another aspect of this embodiment, n is an integer from 0 to 5. In yet another embodiment of this aspect, n is an integer from 0 to 2. In yet another embodiment of this aspect, n is an integer from 0 to 1. In yet another embodiment of this aspect, this acid has the more specific structure (Ic). In another aspect of this embodiment the sulfonic acid has a loading of about 1 wt % to about 10 wt %. In another aspect of this embodiment the wt % loading of this acid is from about 1 wt % to about 6 wt %. In another aspect of this embodiment the wt % loading of this acid is from about 1 wt % to about 5 wt %. In another aspect of this embodiment the wt % is from about 1 wt % to about 3 wt %. In another aspect of this embodiment the wt % is from about 2 wt % to about 3 wt %. In another aspect of this embodiment the wt % is about 2.67 wt %.

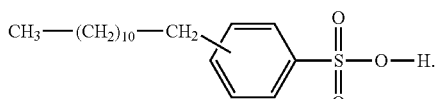

(Ib)

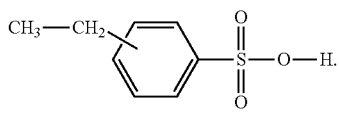

(Ic)

In another embodiment of the above described novel compositions, said sulfonic acid component is a benzene sulfonic acid of structure (Id), wherein said sulfonic acid component is an alkyl benzene sulfonic acid of structure (Id), wherein nb is an integer from 0 to 16.

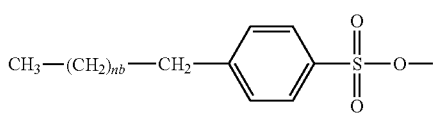

(Id)

In another embodiment of the above described novel compositions, said sulfonic acid component is a benzene sulfonic acid of structure (Id), wherein nb is an integer from 10 to 14.

In another embodiment of the above described novel compositions, said sulfonic acid component is a benzene sulfonic acid of structure (Id), wherein nb is an integer from 8 to 10.

In another embodiment of the above described novel compositions, said sulfonic acid component is a benzene sulfonic acid of structure (Id), wherein nb is an integer from 0 to 10.

In another embodiment of the above described novel compositions, said sulfonic acid component is a benzene sulfonic acid of structure (Id), wherein nb is an integer from 0 to 5.

In another embodiment of the above described novel compositions, said sulfonic acid component is a benzene sulfonic acid of structure (Ie).

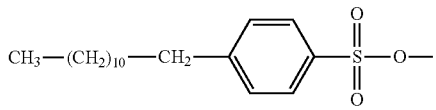

(Ie)

In another embodiment of the above described novel compositions, said sulfonic acid component is a benzene sulfonic acid of structure (If).

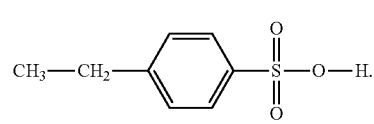

(If)

In another embodiment of any of the above aspects of this composition, the alkylbenzenesulfonic acid component, having structure (Id) has a wt % loading in the total wt of the solution ranging from about 0.1 wt % to about 10 wt %. In another aspect of this embodiment the wt % loading of this acid is from about 0.5 wt % to about 8 wt %. In another aspect of this embodiment the wt % loading of this acid is from about 0.5 wt % to about 6 wt %. In another aspect of this embodiment the wt % is from about 0.5 wt % to about 4 wt %. %. In another aspect of this embodiment the wt % is from about 0.5 wt % to about 3 wt %. In another aspect of this embodiment the wt % is from about 0.5 wt % to about 2.5 wt %. In another aspect of this embodiment the wt % is about 5 wt %. In another aspect of any of the above composition ranges, the alkenesulfonic acid is one having structure (Id) wherein, nb is an integer from 8 to 16. In another aspect nb is an integer from 8 to 14. In yet another aspect, nb is an integer from 8 to 10. In yet another aspect of this embodiment nb is an integer from 8 to 10. In yet another embodiment of this aspect it has structure (Ie).

In another embodiment of the any of the above aspect of this composition, wherein the alkylbenzensulfonic acid has the more specific structure (Id), in a more specific embodiment, nb is an integer from 0 to 10. In still another aspect of this embodiment, nb is an integer from 0 to 5. In yet another embodiment of this aspect, n is an integer from 0 to 2. In yet another embodiment of this aspect, n is an integer from 0 to 1. In yet another embodiment of this aspect, this acid has the more specific structure (If). In another aspect of this embodiment the sulfonic acid has a loading of about 1 wt % to about 10 wt %. In another aspect of this embodiment the wt % loading of this acid is from about 1 wt % to about 6 wt %. In another aspect of this embodiment the wt % loading of this acid is from about 1 wt % to about 5 wt %. In another aspect of this embodiment the wt % is from about 1 wt % to about 3 wt %. In another aspect of this embodiment the wt % is from about 2 wt % to about 3 wt %. In another aspect of this embodiment the wt % is about 2.67 wt %.

In another embodiment of any the above described novel compositions, wherein said sulfonic acid has structure (Ib) or (Ie) and is present from about 0.1 wt % to about 10 wt % of said composition. In another aspect of this embodiment the sulfonic acid has structure (Ie). In another aspect of this embodiment the sulfonic acid is present from about 0.5 wt % to about 2.5 wt %.

In another embodiment of any the above described novel compositions, wherein said sulfonic acid has structure (Ic) or (If) and is present from about 0.1 wt % to about 10 wt % of said composition. In another aspect of this embodiment the sulfonic acid has structure (If). In another aspect of this embodiment the sulfonic acid is present from about 1 wt % to about 3 wt %.

In another embodiment of any of the above aspects of this composition, the dicarboxylic acid having structure (II), oxalic acid, is present from about 0.5 wt % to about 15 wt %. In another aspect of this embodiment, said oxalic acid is present from about 1 wt % to about 12 wt %. In still another embodiment, said oxalic acid is present from about 2 wt % to about 10 wt %. %. In yet another embodiment, said oxalic acid is present from about 3 wt % to about 8 wt %. In still another embodiment, said oxalic acid is present from about 3 wt % to about 5 wt %. In still another embodiment, said oxalic acid is present from about 2 wt % to about 5 wt %.

In another embodiment of any the above described novel compositions, the molar ratio of said sulfonic acid to said dicarboxylic acid is from about 0.01 to about 0.6. In another aspect of this embodiment the molar ratio of said sulfonic acid to said dicarboxylic acid is from about 0.01 to about 0.55. In yet another embodiment, of this aspect of the invention, the molar ratio of said sulfonic acid to said dicarboxylic acid is from about 0.01 to about 0.3. In still another embodiment, of this aspect of the invention, the molar ratio of said sulfonic acid to said dicarboxylic acid is from about 0.1 to about 0.2. In still another aspect of this embodiment, wherein the molar ratio of said sulfonic acid to said dicarboxylic acid is from about 0.1 to about 0.15.

In said solvent component, said organic solvent component selected from organic solvents having by designations (III), (IV), (V), (VI), (VII), (VIII), (IX), (X), and (XI) or mixtures of at least two of these organic solvents, another aspect of this invention is that said solvents or mixtures of these solvents all having boiling points of at least 150° C., at atmospheric pressure above 150° C., ensuring that the composition has a high temperature flash point. For instance, the solvent (III), Dipropylene glycol monomethyl ether (DPGME) (CAS 34590-94-8), has a boiling point of 190° C. Sulfolane (IV) (CAS 126-33-0) has a boiling point of 285° C. The solvent (V), 1,2-propylene glycol, (CAS 57-55-6) has a boiling point of 188.2° C. One of the solvents falling under structure (VI), Tetraglycol (Tetrahydrofurfuryl diethylene glycol ether) (CAS 52818-38-7) has a predicted boiling point of 302.7° C. Similarly, other organic solvents falling within the scope of structure (VI), Tetrahydrofurfuryl alcohol (CAS 97-99-4) and tetrahydrofurfuryl acetate (CAS 637-64-9), respectively, have boiling points at atmospheric pressure of 178° C. and 193° C. Similarly, one of the solvent falling under the structure (VII), (Ra=H), dihydro-2(3H)-Furanone, (CAS 96-48-0) is a solvent which has a boiling point of 204° C.; another solvent falling under this structure (Ra=CH$_3$), dihydro-5-methyl-2(3H)-Furanone, (CAS 108-29-2) has a boiling point of 208° C.; other solvent falling under this structure with R being a higher alkyl group have boiling points higher than the one having R=methyl. Similarly, the solvent having structure (VIII), 3-methoxy-3-methyl-1-Butanol, (CAS 56539-66-3) is a solvent which has a boiling point of 175° C. Similarly, one of the solvent falling under the structure (IX), with Rb=CH$_3$; 1-methyl-2-pyrrolidinone (CAS 670) (NMP) is a solvent having a boiling point of 202° C.; other solvents having with general structure having Rb alkyl substituent which are higher alkyls are solvents which are expected to have boiling points even higher. The solvent having structure (XI), 2-Propoxy-ethanol (CAS 2807-30-9), is a solvent having a boiling point of 150° C. Finally, the solvent having structure (XI), bis(2-methoxyethyl) ether, (CAS 111-96-6) has a boiling point of 162° C.

In another embodiment of the any of the above aspect of this composition, in said solvent component, said organic solvent component is the single organic solvent (III) (Dipropylene glycol monomethyl ether).

In another embodiment of the any of the above aspect of this composition, in said organic solvent component, said organic solvent component is a single organic solvent which has structure (IV)(Tetrahydrothiophene-1,1-dioxide.

In another embodiment of the any of the above aspect of this composition, in said solvent component, said organic solvent component is a single organic solvent which has structure (V).

In another embodiment of the any of the above aspect of this composition, in said solvent component, said organic solvent component is a single organic solvent which has a structure falling within the scope of structures (VI), as previously defined.

In another embodiment of the any of the above aspect of this composition, in said solvent component, said organic solvent component is a mixture of at least two different organic solvents whose structures are ones falling within the scope of structures (VI), as previously defined.

In another embodiment of the any of the above aspect of this composition, in said solvent component, said organic component is at least one organic solvent which has structure (VIa), wherein n' is 1, 2, 3 or 4.

In one embodiment of the above novel compositions, in said solvent component, said organic solvent component has structure (VIa), wherein n' is 1, 2, 3 or 4.

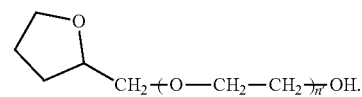

(VIa)

In one embodiment of the above novel compositions, in said solvent component, in said organic solvent component is a mixture of at least two solvents having structure (VIa) having different values of n' 1, 2, 3, or 4.

In one embodiment of the above novel compositions, in said solvent component, said organic solvent component is a single organic solvent having structure (VIb).

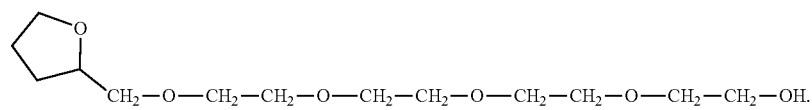

(VIb)

In one embodiment of the above novel composition, in said solvent component, said organic solvent component is a single organic solvent which has structure (VIc).

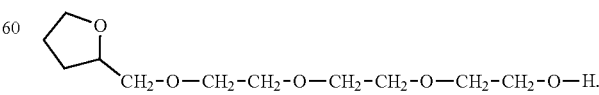

(VIc)

In one embodiment of the above novel compositions, in said solvent component, said organic solvent component is a single organic solvent which has structure (VId).

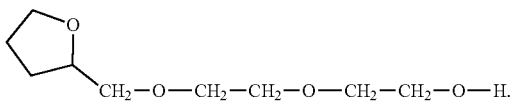
(VId)

In one embodiment of the above novel compositions, in said solvent component, said organic solvent component is a single organic solvent which has structure (VIe).

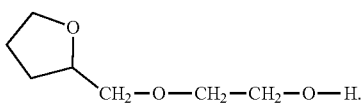
(VIe)

In one embodiment of the above novel compositions, in said solvent component, said organic solvent component is a single organic solvent which has structure (VIf).

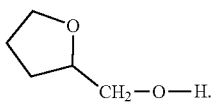
(VIf)

In one embodiment of the above novel compositions in said solvent component, said organic solvent component is a single organic solvent which has structure (VIg).

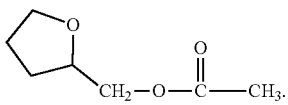
(VIg)

In one embodiment of the above inventive composition, in said solvent component, said organic solvent component is a mixture of at least two different solvents whose structures are ones falling within the scope previously defined for structures (VII).

In one embodiment of the above inventive composition, in said solvent component, said organic solvent component is a single organic solvent which has structure (VIIa).

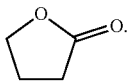
(VIIa)

In one embodiment of the above inventive composition, in said solvent component, said organic solvent component is a single organic solvent which has structure (VIIb).

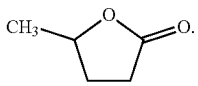
(VIIb)

In one embodiment of the above inventive composition in said solvent component, said organic solvent component is a single organic solvent which has structure (VIIc).

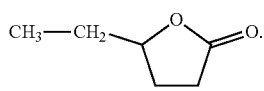
(VIIc)

In one embodiment of the above inventive composition, in said solvent component, said organic solvent component is a single organic solvent which has structure (VIId).

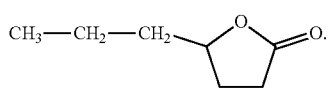
(VIId)

In one embodiment of the above inventive composition, in said solvent component, said organic solvent component is a single organic solvent which has structure (VIIe).

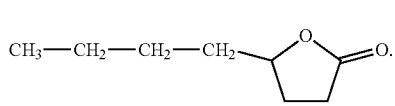
(VIIe)

In one embodiment of the above inventive composition, in said solvent component, said organic solvent component is a single organic solvent which has structure (VIII).

In one embodiment of the above inventive composition, in said solvent component, said organic solvent component is a mixture of at least two different organic solvents whose structures are ones falling within the previously defined scope of structures (IX).

In one embodiment of the above inventive composition, in said solvent component, said organic solvent component is a mixture of at least two different organic solvent whose structures are ones falling within the scope of structures (IX), wherein Rb is a C-1 to C-12 alkyl. In another aspect of this embodiment Rb is a C-1 to C-8 alkyl. In yet another embodiment of this aspect, Rb is a C-1 to C-4 alkyl.

In one embodiment of the above inventive composition, in said solvent component, said organic solvent component is a single organic solvent which has structure (IXa).

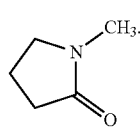
(IXa)

In one embodiment of the above inventive composition in said solvent component, said organic solvent component is a single organic solvent which has structure (IXb).

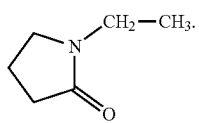
(IXb)

In one embodiment of the above inventive composition, in said solvent component, said organic solvent component is a single organic solvent which has structure (IXc).

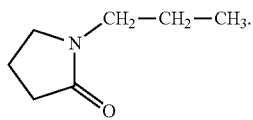
(IXc)

In one embodiment of the above inventive composition in said solvent component, said organic solvent component is a single organic solvent which has structure (IXd).

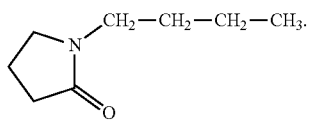
(IXd)

In one embodiment of the above inventive composition, in said solvent component, said organic solvent component is a single organic solvent which has structure (XI).

In one embodiment of the above inventive composition, in said solvent component, said organic solvent component is a single organic solvent which has structure (XI).

In the above embodiments of the novel composition, wherein said organic solvent component is a mixture of at least two solvents selected from organic solvents (III), (IV), (V), (VI), (VII), (VIII), (IX), (X), and (XI), non-limiting examples of possible embodiments are as follows:

Binary, tertiary or greater mixtures of solvents either selected from the structures embodied by structure (VI), or mixtures of any of these organic solvents having the structures embodied in structure (VI) with any of single organic solvent (III), (IV), (V) (VI), (VIII), (IX), (X), or (XI). Binary or tertiary mixtures of organic solvents having structure (VII), either selected from the organic solvent having structures (VII) or mixtures of these organic solvents with the organic solvents having structures (III), (IV), (V) (VI), (IX), (X), or (XI). Binary or tertiary mixtures of organic solvents having structure (VII), either selected from the organic solvents having structure (IX) or mixtures of these organic solvents with the organic solvents having structures (III), (IV), (V) (VI), (VII), (X) or (XI). One embodiment of specific organic solvent mixtures are mixtures of different solvents having general structure (VIa) with different values of n'. Non-limiting examples of this aspect of the invention are, for instance, quaternary mixtures of (VIb), (VIc), (VId), and (VIe); tertiary mixtures of (VIc), (VId) and (VIe), or (VIb), (Ic) and (VIe), or (VIb), (VId) and (VIe), and the like; binary mixtures of (VIb) and (VIc), or (VIb) and (VId), or (VIb) and (VIe), or (VIc) and (VId), or (VIc) and (VIe), or (VId) and (VIe). Mixtures of different organic solvents having structure (VII) as described above, may also be combined with at least one organic solvent selected from the group consisting of organic solvents (VIf), (VIg), (III), (IV), (V), (VIII), (IX), (X), and (XI).

The solvent component in addition to the organic solvent components described herein may also contain water from slightly above 0 wt % to about 15 wt %. In one particular embodiment, the water ranges from about 3 to about 8 wt %.

In a specific embodiment, the organic solvent component of said organic solvent component is a mixture of organic solvents, said mixture consists only of a mixture of a organic solvent of structure (III) (Dipropylene glycol monomethyl ether) and a organic solvent of structure (IV) (Tetrahydrothiophene-1,1-dioxide); wherein in said mixture, said organic solvent of structure (III) ranges from about 90 wt % to about 50 wt % of said mixture of organic solvents. In another aspect of this embodiment of this mixture solvent (III) ranges from about 70 wt % to about 50 wt %. In another aspect of this embodiment of this mixture solvent (III) ranges from about ranges from about 60 wt % to about 50 wt % of said mixture of solvents.

The novel remover formulation may be use to remove resist by either using a dipping or a spraying process, wherein the remover solution is applied at a temperature between about room temperature to about 100° C.; in another embodiment it may be applied from about 40 to 80° C.

Another embodiment of this invention is a process comprising the steps;
i) heating any one of the composition described above, at a temperature which is from about room temperature to about 100° C.;
ii) dipping a substrate coated with a patterned photoresist film into said heated composition for a time from about 1 minutes to about 60 minutes, until, a dipped substrate with a removed photoresist film, results;
iii) after dipping step ii), rinsing said dipped substrate with a removed photoresist film with either isopropyl alcohol, water or a mixture of isopropyl alcohol and water to remove any residual composition from dipping step ii), producing a clean substrate;
iv) drying said clean substrate, by either spin drying it in air, or by using a stream of nitrogen or air to dry it.

In another embodiment of the above inventive process, it is one, wherein in step i), the composition is heated from about 40° C. to about 80° C.

In another embodiment of the above inventive process, it is one, wherein in step ii), the substrate is a metal. In one aspect of this embodiment the metal is selected from Aluminum, Aluminum/copper alloys, Copper, Titanium, Tungsten and Nickel. In another aspect of this embodiment of the process, the metal is selected from Aluminum, Aluminum/copper alloys, and copper. In still another embodiment of the above inventive process, it is one, wherein in step ii), the substrate is copper.

In another embodiment of the above inventive process, it is one, wherein in step ii), the substrate is dipped from about 5 minutes to about 30 minutes.

In another embodiment of the above inventive process, it is one, wherein in step iii) the rinse is done with water.

The spraying process using the novel remover process may employ similar temperature and timeframes as described above.

The novel remover composition may be used in the above inventive process to remove patterns from many different types of photoresist patterns, which are as follows:

The novel remover may be used to remove patterned resist films having a variety of thicknesses depending on the application, IC devices, IC devices interconnect, circuit board, solder board application, MEM, display and the like. Typically, the thickness tracts with the size of the device being manufactured starting from about tens of nanometers for state of the art IC, to the several microns range for larger IC devices, to 10 to 500 microns for very large devices such as MEM's.

The removers of the present disclosure can be used with resist pattern which arise from negative and positive photoresist material capable of forming patterns which may be selected from ones which may form patterns using different types of radiation. For instance, as non-limiting examples resist patterns for removal may be formed from i-line photoresists, g-line photoresists 248 nm photoresists, 193 nm photoresist, Extreme Ultraviolet photoresists, electron beam photoresists and particle beam photoresists. The removers of the present disclosure can be used with photoresist patterns may arise from photoresists which may be further classified as follows by the type of chemistry which is employed to obtain the pattern.

For instance, the removers of the present disclosure may be used to remove positive pattern resulting from, exposure by visible, i-line, h-line, and g-line and development by aqueous base employ of photoresists based upon a Novolak resin and a diazonaphthoquinone type sensitizer (DNQ) sensitizer material, these types of resist system may also yield negative images through a tone reversal process. Diazonapthoquinone Novolak based resists are described in (Diazonapththoquinone-based Resists, Chapter 2, Basic Chemistry of DNQ/Novolak resists, SPIE Optional Engineering Press volume TT 11, page 9, 1993), which are hereby incorporated by reference in its entirety.

The removers of the present disclosure can be used to remove resist patterns resulting from both negative or positive photoresist which are chemically amplified and aqueous base developable. Typically, resist patterns are formed by 248 nm, 193 nm, EUV to enable higher resolutions patterns, but resist patterns may also be produced using longer wavelengths, such as visible, broadband UV, i-line, g-line, and h-line.

The removers of the present disclosure can be used to remove resist patterns resulting from positive tone chemically amplified resists, resins which are latently aqueous base soluble, such as (meth)acrylate copolymers, styrenic copolymer, Novolaks, phenolic resins, are rendered aqueous base soluble by deprotecting acid cleavable group which mask aqueous base solubilizing moieties. The base solubilizing moieties may be carboxylic acids, phenols, or other moieties having typically a pKa below 11 such that aqueous base will largely ionize them. The acid is generated in exposed areas of the photoresist film by a photoacid generating compound. This acid deprotects the acid cleavable group through a process of acidolysis, or hydrolysis, releasing a free base solubilizing moieties, allowing, in exposed areas for the photoresist film to be aqueous base soluble.

The removers of the present disclosure can be used to remove resist patterns resulting from negative tone chemically amplified, whose inherent aqueous base solubility is not masked by any protecting group. Rather, in this approach, an inherently base soluble resin (binder resin) such as ones based on aqueous base soluble (meth)acrylate copolymers, styrenic copolymer, Novolaks, and the like are crosslinked catalytically by photo-acid through acid crosslinking moieties. These moieties may be pendent to the binder resins themselves, present on crosslinking additives (crosslinking agents) or present on both the resins and the additives. Acid catalyzed crosslinking in exposed areas is affected through a photo-acid generated by a PAG, which results, after aqueous base development in a negative tone image. Typically, when a crosslinking additive is employed it is a moiety capable of forming a carbonium ion upon interaction with the photoacid such as an aminoplast, or an additive containing acid crosslinkable group such as an epoxy compound. Similarly, if the crosslinking moiety is present on the resin it may either be a moiety capable of forming a carbonium ion with acid, or a moiety which can undergo crosslinking with an acid such as an epoxy moiety. The following reference is a review of chemically amplified resist: (H. Ito, Adv Polym Sci 2005 I72 p 37).

The removers of the present disclosure can be used to remove resist patterns resulting from negative chemically amplified resist may result from negative chemically amplified resists, where the binder resins may comprise a novolak, for instance ones derived from a substituted phenol such as ortho-cresol; meta-cresol; para-cresol; 2,4-xylenol; 2,5-xylenol; 3,4-xylenol, 3,5-xylenol, thymol and mixtures thereof, that has been condensed with an aldehyde such as formaldehyde. In other approaches, the binder resin may also comprise a poly(vinyl phenol) such as a poly(para-hydroxystyrene); a poly(para-hydroxy-alpha-methylstyrene; a copolymer of para-hydroxystyrene or para-hydroxy-alpha-methylstyrene and styrene, acetoxystyrene or acrylic acid and/or methacrylic acid; a hydroxyphenylalkyl carbinol homopolymer; or a novolak/poly(vinyl phenol) copolymer. The crosslinking additives, for such negative chemically amplified resist, may be etherified aminoplast crosslinking functionalities containing within a small compound, an organic oligomer, or a polymer. Such aminoplasts, provide a carbonium ion, upon acid cleavage, and serves to crosslink the binder resin in the presence of an acid generated by radiation, preferably imaging radiation. This crosslinking renders the binder resin insoluble in an alkaline medium, in the exposed areas. Such crosslinking agents may be prepared from a variety of aminoplasts in combination with a compound or low molecular weight polymer containing a plurality of hydroxyl, carboxyl, amide or imide groups. Some examples of amino oligomers or polymers are aminoplasts obtained by the reaction of an amine, such as urea, melamine, or glycolurea with an aldehyde, such as formaldehyde. Suitable aminoplasts may include urea-formaldehyde, melamine-formaldehyde, benzoguanamine-formaldehyde, and gylcoluril-formaldehyde resins, and combinations of any of these. In some applications, the aminoplast is a hexa(methoxymethyl) melamine oligomer. A non-limiting example of such materials is described in U.S. Pat. No. 6,576,394.

The removers of the present disclosure can be used with negative resist patterns for use with the novel low pKa remover compositions and processes described above, may result from negative crosslinking resists which are based upon crosslinking initiated by a photoradical generator, instead of a photoacid generator. In this instance, the same type of binder resins may be employed as described above for the chemically amplified negative photoresists. However, in this instance a crosslinking additive is present which comprises at least two olefinic moiety, which is easily susceptible to radical crosslinking. Examples of such moieties are, vinyl aryl moieties such as styrenes, and acrylate or methacrylate moieties. Non-limiting, more specific examples of these radical crosslinking additive can be appropriately selected, depending on the purposes, from acrylic acid derivatives such as acrylic acid esters and methacrylic acid derivatives such as methacrylic acid esters. These may have a low molecular weight (monomer property) or a high molecular weight (oligomer or polymer property). In this instance, the additive may be small molecule, an oligomer or a polymer which contain multiple radical crosslinkable moieties. Some of these radical crosslinking additives may have structures within them which are acid cleavable. Such structures may be of use during further processing of the patterned film, for instance in facilitating stripping of the resist after pattern transfer into the substrate. Examples of such acid cleavable groups are tertiary ethers, tertiary carboxylates, and the like which are susceptible to acidolytic cleavage without advantageous water, or alternatively acid cleavable moieties which may readily undergo complete hydrolytic cleavage with photo-acid advantageous water in the resist film such as acetal, ketals, and alkyl silyl ethers. A non-limiting example of such materials is described in U.S. Pat. No. 7,601,482.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Chemicals

DDBSA (dodecylbenzenesulfonic acid; CAS: 68584-22-5) was obtained from Stepan (22 West Frontage Rd., Northfield, Ill. 60093). Filtrez 591 was obtained from Lawter (Chicago Ill.) All other chemicals unless otherwise indicated were purchased from Sigma Aldrich (3050 Spruce St., St. Louis, Mo. 63103) as listed in Table 1.

Formulations Procedure

The formulation as described in Table 1 and 2 were prepared as follows: Formulations containing sulfolane as a co-organic organic solvent started with a stock solution containing sulfolane with the other organic solvent, a surfactant and also water if this component is present. Then the specific sulfonic acid and oxalic acid were added to this stock solution and mixed in. Formulations not containing sulfolane were made by adding the components of each composition together in a container (e.g. glass beaker) and mixing these components together until a homogeneous solution was obtained.

Formulations Testing

Silicon 200 mm (8") wafers with 150 nm copper sputter coating were used for metal corrosion testing. A copper coated silicon wafer coupon was immersed in a preheated photoresist remover solution for a time of periods that were more than enough to strip a photoresist. Regular inspection was done to check the condition of the metal surface by visual and microscopic inspection for the presence of surface haze as indicative of corrosion. Surface haze can be identified and confirmed at levels more sensitive than gravimetric analysis (<10 Å/min).

For photoresist stripping tests, unless otherwise stated, silicon wafers with 150 nm sputtered copper were used as the substrate upon which a chemically amplified negative photoresist AZ-15nXT (a product of EMD Performance Materials, Branchburg, N.J. 08876) was applied and processed. The processing consisted of spin coating the resist to a 12 µm thickness and applying a soft bake on a hotplate at 110° C. for 180 sec. The resist was then exposed to 900 mJ/cm2 of light through a contact hole patterned mask. A post-exposure bake was completed on a hotplate at 120° C. for 60 seconds before developing the resist. Development used AZ 300 MIF Developer in two puddles of 60 seconds each followed by a rinse with DI water.

To test each formulation, described in Table 2 (working remover formulations) and Table 3 (comparative remover formulations), about 100-200 mL of remover was put into a glass beaker along with a stir bar. The remover was heated to the desired temperature (usually 25° C.-80° C.) and stirred at about 300 rpm. A coupon of a copper wafer covered in patterned AZ® 15nXT photoresist is submerged in the beaker for between 1 and 30 minutes. After, the coupon is rinsed directly with water and then blown dry with $N_2$. The coupon is then inspected for remaining resist and any copper corrosion. Acceptable results, as shown in Table 1, indicated a working remover, which were ones in which the resist was removed completely, dissolving all the resist film with no resist film lift off, and also showed either no corrosion or only slight corrosion of the copper substrate, and further showed no deposition of particles on the copper wafer after processing. Thus, the novel composition could effectively remove resist by complete dissolution, and suppressed copper corrosion without the need of polymers of charge complexing character, or metal protecting Rosins modified by an unsaturated anhydride (e.g fumarated Rosins), which we have observed led to undesirable particle deposition when present. In particular, particle deposition on stripped wafers was observed in remover formulations containing the metal protecting Rosin component (Filtrez 5-91A) (see Table 3). Unacceptable results using composition outside the inventive composition are summarized in Table 3. Such unacceptable results arose either because the composition could not remove the resist at all, or removed the resist by lifting it off the substrate. Such lift-off of resist instead of complete dissolution was undesirable because it led to clogging of filters in Micro lithographic cleaning equipment. Other unacceptable results observed in Table 3 were for certain formulations where severe corrosion of copper was observed. In particular it is observed that removal of oxalic acid as a component led to failure of the remover solutions. Similarly, replacement of oxalic acid with another dicarboxylic such as malonic acid also led to poor remover performance. Also, replacement of the specific organic solvent components of the inventive remover composition with other organic solvent components, led to failure of these comparative compositions as removers.

In summary, these inventive remover compositions were found to quickly remove negative crosslinked photoresists by complete dissolution without significantly corroding copper, or leaving behind residues or particles after rinsing directly with water. They removed these resists patterns not by delaminate the resist film, but by quickly dissolve it. This prevented filter clogging in industrial wet cleaning tools which would otherwise occur with delamination of resist films. After treatment with the inventive remover compositions, the wafers could be rinsed directly with water without either causing precipitation of solids from the solution or needing an intermediate rinse beforehand. When removing resist from copper substrates, the inventive remover composition could effectively do so without imparting significant corrosion of copper, surprisingly without the need of a metal protecting Rosin compound or polymer complexing type compound. Metal protecting Rosins type compounds, if present were observed in the comparative examples to engender undesirable particle deposition during resist stripping. The inventive remover compositions were also observed to be able to effectively strip substrates coated with some patterned positive-tone photoresists, unlike many standard negative-tone resist removers, which were not able to accomplish both stripping of negative and positive resist.

TABLE 1

Chemicals

| Abreviation or name | CAS# | Full Chemical name or desciption | Numbering |
|---|---|---|---|
| Filtrez 591 | No CAS applies | fumaric modified Rosin ester | NA |
| DDBSA | 68584-22-5 | Dodecylbenzenesulfonic acid | Ie |
| oxalic acid | 144-62-7 | Oxalic acid | II |
| DPGME | 34590-94-8 | Dipropylene glycol monomethyl ether | III |
| sulfolane | 126-33-0 | Tetrahydrothiophene-1,1-dioxide | IV |
| 1,2-Propanediol | 57-55-6 | 1,2-Propanediol | V |
| THFAC | 872-50-4 | tetrahydrofurfuryl acetate | VIg |
| THFA | 97-99-4 | Tetrahydrofurfuryl alcohol | VIf |
| BUTLAC | 96-48-0 | γ-butyrolactone | VIIa |
| VALAC | 108-29-2 | γ-valerolactone | VIIb |
| MMBOL | 56539-66-3 | methyoxy-3-methyl-1-butanol | VIII |
| NMP | 872-50-4 | N-methylpyrrolidone | IXa |
| EGPE | 2807-30-9 | ethylene glycol monopropyl ether | X |
| DEGME | 111-96-6 | diethylene glycol dimethyl ether | XI |
| EGMBA | 112-07-2 | ethylene glycol monobutyl ether acetate | |
| DEGMEA | 112-15-2 | diethylene glycol monoethyl ether acetate | |
| 4-EBSA | 98-69-1 | 4-Ethylbenzenesulfonic acid | |
| malonic acid | 141-82-2 | malonic acid | |
| tridecyl alcohol | 112-70-9 | tridecyl alcohol | |
| IPA | 67-63-0 | Isopropyl alcohol | |
| DMSO | 67-68-5 | Dimethyl sulfoxide | |

TABLE 2

Working compositions

| Example | Sulfonic acid wt % | Solvent wt % | Water wt % | oxalic acid wt % | Tridecyl alcohol wt % | Comments | Ratio Wt % Sulfonic acid/ oxalic acid | mole ratio |
|---|---|---|---|---|---|---|---|---|
| Ex. 1 | DDBSA 2 | DPGME 55.5 Sulfolane 31.9 | 4.7 | 4 | 1.9 | Dissolves resist and does not corrode copper | 0.5 | 0.14 |
| Ex 2 | DDBSA 1.5 | DPGME 55.8 Sulfolane 32.1 | 4.8 | 4 | 1.9 | Dissolves resist and does not corrode copper | 0.3125 | 0.09 |
| Ex. 3 | DDBSA 2.5 | DPGME 55.2 Sulfolane 31.7 | 4.7 | 4 | 1.9 | Dissolves resist and does not corrode copper; | 0.625 | 0.17 |
| Ex. 4 | DDBSA 2 | DPGME 56.6 Sulfolane 32.6 | 4.8 | 2 | 1.9 | Dissolves resist and does not corrode copper | 1 | 0.28 |
| Ex. 5 | DDBSA 1 | DPGME 57.2 Sulfolane 32.9 | 4.9 | 2 | 1.9 | Dissolves resist and does not corrode copper | 0.5 | 0.14 |
| Ex. 6 | DDBSA 2 | DPGME 57.2 Sulfolane 32.9 | 4.9 | 1 | 1.9 | Dissolves resist and does not corrode copper | 2 | 0.55 |
| Ex. 7 | DDBSA 0.5 | DPGME 56.3 Sulfolane | 4.8 | 4 | 1.9 | Dissolves resist and does not corrode copper | 0.125 | 0.03 |
| Ex. 8 | DDBSA 2 | DPGME 55.5 Sulfolane 31.9 | 4.7 | 4 | 1.9 | Dissolves resist and does not corrode copper | 0.5 | 0.14 |
| Ex. 9 | DDBSA 0.1 | DPGME 56.6 Sulfolane 32.6 | 4.8 | 4 | 1.9 | Dissolves resist and does not corrode copper | 0.025 | 0.01 |

TABLE 2-continued

Working compositions

| Example | Sulfonic acid wt % | Solvent wt % | Water wt % | oxalic acid wt % | Tridecyl alcohol wt % | Comments | Ratio Wt % Sulfonic acid/ oxalic acid | mole ratio |
|---|---|---|---|---|---|---|---|---|
| Ex. 10 | DDBSA 2 | DPGME 89.0 | 5 | 4 | — | Dissolves resist and does not corrode copper | 0.5 | 0.14 |
| Ex. 11 | DDBSA 2 | DPGME 84.0 | 10 | 4 | — | Dissolves resist and does not corrode copper | 0.5 | 0.14 |
| Ex. 12 | DDBSA 2 | DPGME 86.0 Sulfolane | 8 | 4 | — | Dissolves resist and does not corrode copper | 0.5 | 0.14 |
| Ex. 13 | DDBSA 2 | DPGME 82.0 | 12 | 4 | — | Dissolves resist and does not corrode copper | 0.5 | 0.14 |
| Ex. 14 | DDBSA 2 | DPGME 74.0 | 20 | 4 | — | Dissolves resist and does not corrode copper | 0.5 | 0.14 |
| Ex. 15 | DDBSA 2 | DPGME 80.0 | 14 | 4 | — | Dissolves resist and does not corrode copper | 0.5 | 0.14 |
| Ex. 16 | DDBSA 2 | DPGME 78.0 | 16 | 4 | — | Dissolves resist and does not corrode copper | 0.5 | 0.14 |
| Ex. 17 | DDBSA 2 | DPGME 76.0 | 18 | 4 | — | Dissolves resist and does not corrode copper | 0.5 | 0.14 |
| Ex. 18 | EBSA 2 | DPGME 82.0 | 12 | 4 | — | Dissolves resist and does not corrode copper | 0.5 | 0.24 |
| Ex. 19 | DDBSA 2 | DPGME 82 | 12 | 4 | — | Dissolves resist and does not corrode copper | 0.5 | 0.14 |
| Ex. 20 | DDBSA 2 | EGPE 82 | 12 | 4 | — | Dissolves resist and does not corrode copper | 0.5 | 0.14 |
| Ex. 21 | DDBSA 0.1 | DPGME 83.9 | 12 | 4 | — | Dissolves resist and does not corrode copper | 0.5 | 0.14 |
| Ex. 22 | DDBSA 2 | DPGME 80 | 8 | 10 | — | Dissolves resist and does not corrode copper | 0.5 | 0.14 |
| Ex. 23 | DDBSA 10 | DPGME 78 | 8 | 4 | — | Dissolves resist and does not corrode copper | 0.5 | 0.14 |
| Ex. 24 | Tosic acid-2 | DPGME 86 | 8 | 4 | — | Dissolves resist and does not | 0.5 | 0.24 |

TABLE 2-continued

| | | | | oxalic | Tridecyl | | Ratio Wt % | |
| | Sulfonic | Solvent | Water | acid | alcohol | | Sulfonic acid/ | mole |
| Example | acid wt % | wt % | wt % | wt % | wt % | Comments | oxalic acid | ratio |
|---|---|---|---|---|---|---|---|---|
| Ex. 25 | CFSA 2 | DPGME 86 | 8 | 4 | — | corrode copper Dissolves resist and does not corrode copper | 0.5 | 0.19 |
| Ex. 26 | DDBSA 2 | TTGOL 86 | 8 | 4 | — | Dissolves resist and does not corrode copper | 0.5 | 0.14 |
| Ex. 27 | DDBSA 2 | —THFAC 86 | 8 | 4 | — | Dissolves resist and does not corrode copper | 0.5 | 0.14 |
| Ex. 28 | DDBSA 2 | —MMBOL 86 | 8 | 4 | — | Dissolves resist and does not corrode copper | 0.5 | 0.14 |
| Ex. 29 | DDBSA 2 | —BUTLAC 86 | 8 | 4 | — | Dissolves resist and does not corrode copper | 0.5 | 0.14 |
| Ex. 30 | DDBSA 2 | —VALAC 86 | 8 | 4 | — | Dissolves resist and does not corrode copper | 0.5 | 0.14 |
| Ex. 31 | DDBSA 2 | —NMP 86 | 8 | 4 | — | Dissolves resist and does not corrode copper | 0.5 | 0.14 |
| EX. 32 | DDBSA 2 | DPGME 92.0 | 0 | 4 | 2 | Dissolves resist and does not corrode copper; | 0.5 | 0.14 |
| EX. 33 | DDBSA 3 | DPGME 54.9 sulfolane 31.6 | 4.7 | 4 | 1.9 | Dissolves resist and shows slight corrosion of copper | 0.75 | 0.21 |
| EX. 34 | DDBSA 4 | DPGME 54.3 sulfolane 31.2 | 4.6 | 4 | 1.8 | Dissolves resist and shows slight corrosion of copper | 1.00 | 0.28 |
| EX. 35 | DDBSA 5 | DPGME 53.7 sulfolane 30.9 | 4.6 | 4 | 1.8 | Dissolves resist and shows slight corrosion of copper | 1.25 | 0.34 |
| EX. 36 | DDBSA 3 | DPGME 54.9 sulfolane 31.6 | 4.9 | 1 | 2 | Dissolves resist and shows slight corrosion of copper | 1.00 | 0.28 |
| EX. 37 | DDBSA 2 | DPGME 94.0 | 0 | 4 | — | Dissolves resist and does not corrode copper | 0.5 | 0.14 |

TABLE 3

Comparative Examples

| Example | Sulfonic acid wt % | Solvent wt % | Water wt% | Oxalic acid wt % | Malonic acid wt % | Tridecyl alcohol wt % | Fumaric Modified Resin wt % | Comment | Ratio Wt % Sulfonic acid/oxalic acid | mole ratio sulfonic acid/oxalic acid |
|---|---|---|---|---|---|---|---|---|---|---|
| Comp Ex. 1 | | DPGME 56.6 sulfolane 32.6 | 4.8 | 4 | | 1.9 | | -Does not dissolve resist fast enough lift off | NA | NA |
| Comp Ex. 2 | | DPGME 57.2 sulfolane 32.9 | 4.9 | 3 | | 1.9 | | -Does not dissolve resist fast enough lift off | NA | NA |
| Comp Ex. 3 | | DPGME 56.6 sulfolane 32.9 | 4.8 | 4 | | 1.9 | | Does not dissolve resist fast enough lift off | NA | NA |
| Comp Ex. 4 | | DPGME 56.1 sulfolane 32.3 | 4.8 | 5 | | 1.9 | | -Does not dissolve resist fast enough lift off | NA | NA |
| Comp Ex. 5 | | DPGME 54.6 sulfolane 31.4 | 4.7 | 7.5 | | 1.9 | | -Does not dissolve resist fast enough lift off | NA | NA |
| Comp Ex. 6 | | DPGME 53.1 sulfolane 30.6 | 4.5 | 10 | | 1.8 | | -Does not dissolve resist fast enough lift off | NA | NA |
| Comp Ex. 7 | | DPGME 64.0 sulfolane 32.0 | 0 | 4 | | — | | Severe Cu corrosion- | NA | NA |
| Comp Ex. 8 | DDBSA 2 | DPGME 82.0 | 12 | 0 | 4 | — | | Severe Cu corrosion- | NA | NA |
| Comp Ex. 9 | | DPGME 59.0 sulfolane 33.95 | 5.05 | 0 | | 2 | | Does not dissolve resist fast enough lift off | NA | NA |
| Comp Ex. 10 | DDBSA 2 | DPGMEA-82.0 | 12 | 4 | | — | | Severe Cu corrosion- | 0.50 | 0.14 |
| Comp Ex. 11 | DDBSA 6 | IPA 55- | 37 | 2 | | — | | does not remove resist | 3.00 | 0.83 |
| Comp Ex. 12 | DDBSA 8 | benzl alcohol 5 | 87 | 0.4 | | — | | Severe Cu corrosion- | 20.00 | 5.52 |
| Comp Ex. 13 | DDBSA 8 | DPGME 90 | — | — | | — | 5 | Severe Cu corrosion- + particle deposition | NA | NA |
| Comp Ex. 14 | DDBSA 5 | DPGME 900 | — | — | | — | 5 | Severe Cu corrosion- + particle deposition | NA | NA |
| Comp Ex. 15 | DDBSA 5 | DPGME 45 EGMBA 45 | — | — | | — | 5 | Severe Cu corrosion- + particle deposition | NA | NA |
| Comp Ex. 16 | DDBSA 5 | DPGME 90 | — | — | | — | 5 | Severe Cu corrosion- + particle deposition | NA | NA |
| Comp Ex. 17 | DDBSA 5 | -THFA 90 | — | — | | — | 5 | particle deposition | NA | NA |
| Comp Ex. 18 | DDBSA 1 | DPGME 94 | — | — | | — | 5 | Severe Cu corrosion- + particle deposition | NA | NA |
| Comp Ex. 19 | DDBSA 1 | DPGME 94 | — | — | | — | 5 | Severe Cu corrosion- + particle deposition | NA | NA |

TABLE 3-continued

Comparative Examples

| Example | Sulfonic acid wt % | Solvent wt % | Water wt% | Oxalic acid wt % | Malonic acid wt % | Tridecyl alcohol wt % | Fumaric Modified Resin wt % | Comment | Ratio Wt % Sulfonic acid/oxalic acid | mole ratio sulfonic acid/oxalic acid |
|---|---|---|---|---|---|---|---|---|---|---|
| Comp Ex. 20 | DDBSA 1 | -THFA 94 | — | — | — | — | 5 | particle deposition | NA | NA |
| Comp Ex. 21 | — | DPGME 94 | — | 1 | — | — | 5 | particle deposition | NA | NA |
| Comp Ex. 22 | — | DPGME 91 | — | 4 | — | — | 5 | particle deposition | NA | NA |
| Comp Ex. 23 | — | DPGME 95 | — | 4 | — | — | 1 | particle deposition | NA | NA |
| Comp Ex. 24 | — | -DEGMEA 95 | — | 4 | — | — | 1 | particle deposition | NA | NA |
| Comp Ex. 25 | 1 | -sulfolane 94 | — | — | — | — | 5 | Severe Cu corrosion- + water-insoluble component | NA | NA |
| Comp Ex. 26 | — | -THFA 91 | — | 4 | — | — | 5 | water-insoluble component | NA | NA |
| Comp Ex. 27 | DDBSA 1 | DPGME 62.7 sulfolane 31.3 | — | — | — | — | 5 | Severe Cu corrosion- + water-insoluble component | NA | NA |
| Comp Ex. 28 | — | DPGME 60.7 sulfolane 30.3 | — | 4 | — | — | 5 | water-insoluble component | NA | NA |
| Comp Ex. 29 | — | DPGME 63.3 sulfolane 31.6 | — | 4 | — | — | 1 | Severe Cu corrosion- + water-insoluble component | NA | NA |
| Comp Ex. 30 | DDBSA 2 | DMSO 86 | 8 | 4 | — | — | — | Severe Cu corrosion- | 0.50 | 0.14 |

We claim:

1. A composition consisting of a sulfonic acid component selected from the group consisting of camphor sulfonic acid, and a benzene sulfonic acid of structure (I), wherein R is H or a C-1 to C-18 n-alkyl;

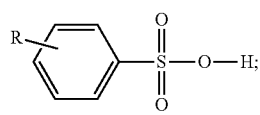
(I)

a dicarboxylic acid having structure (II),

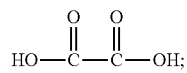
(II)

a solvent component which consists essentially of an organic solvent component, or a mixture of an organic solvent component and water, wherein the organic solvent component consists of about 100 wt % to about 85 wt % of said solvent component, and further wherein said organic solvent component is either selected from the group consisting of solvents (III), (IV), (V), (VI) (wherein R is selected from the group consisting of —(—O—CH$_2$—CH$_2$—)$_{n'}$—OH, —OH, and —O—C(=O)—CH$_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least solvents selected from this group;

Dipropylene glycol monomethyl ether (III),

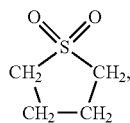
(IV)

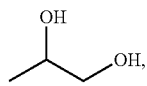
(V)

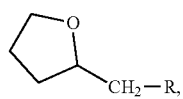
(VI)

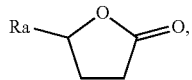
(VII)

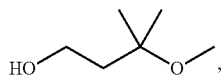
(VIII)

-continued

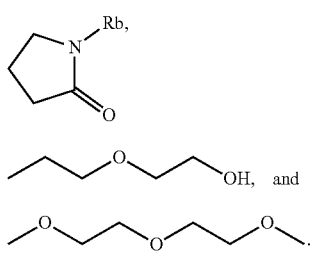

2. A composition consisting of:
a sulfonic acid component selected from the group consisting of camphor sulfonic acid, and a benzene sulfonic acid of structure (I), wherein R is H or a C-1 to C-18 n-alkyl;

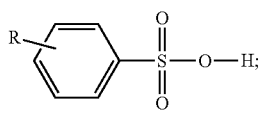

a dicarboxylic acid having structure (II),

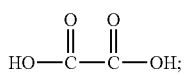

a solvent component which consists essentially of an organic solvent component, or a mixture of an organic solvent component and water, wherein the organic solvent component consists of about 100 wt % to about 85 wt % of said solvent component, and further wherein said organic solvent component is either selected from the group consisting of solvents (III), (IV), (V), (VI) (wherein R is selected from the group consisting of —(—O—CH$_2$—CH$_2$—)$_{n'}$—OH, —OH, and —O—C(=O)—CH$_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least two organic solvents selected from this group;
Dipropylene glycol monomethyl ether (III),

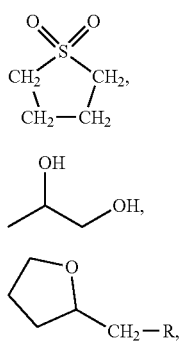

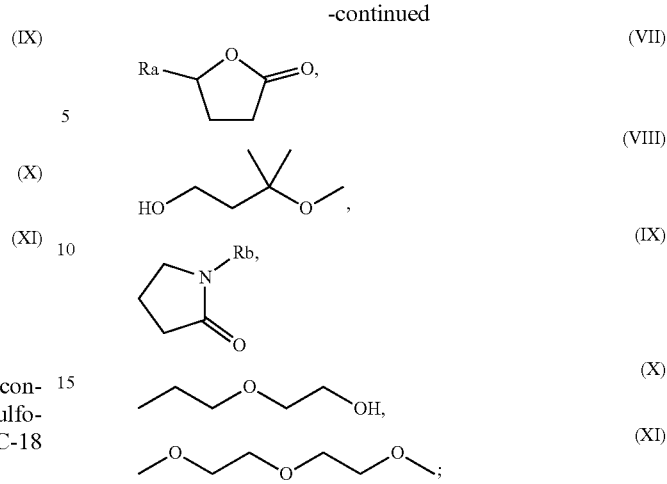

and a surfactant.

3. The composition of claim 2, wherein said surfactant is a polymeric surfactant having structure (XII), wherein n''' is the number of polymer repeat unit and na is the number of CH$_2$ spacer moieties, which is an integer from 8 to 14

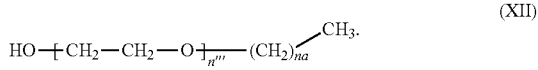

4. The composition of claim 2, wherein said sulfonic acid component is camphor sulfonic acid.

5. The composition of claim 2, wherein said sulfonic acid component is a benzene sulfonic acid of structure (I).

6. The composition of any one of claim 2, wherein said sulfonic acid component is an alkyl benzene sulfonic acid of structure (Ia), wherein n is an integer from 0 to 16;

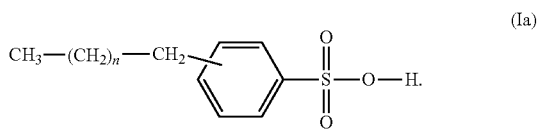

7. The composition of claim 6, wherein in said alkylbenzenesulfonic acid (Ia), n is an integer from 8 to 16.

8. The composition of claim 6, wherein for said alkylbenzenesulfonic acid n is an integer from 0 to 5.

9. The composition of claim 2 wherein said sulfonic acid is present from about 0.1 wt % to about 10 wt % of said composition.

10. The composition of claim 2, wherein the molar ratio of said sulfonic acid to said dicarboxylic acid is from about 0.01 to about 0.6.

11. The composition of claim 2, wherein in said solvent component, has structure (III).

12. The composition of claim 2, wherein, said organic solvent component is a single organic solvent which has structure (IV).

13. The composition of claim 2, wherein said organic solvent component has structure (V).

14. The composition of claim 2, wherein in said solvent component, said organic solvent component is a single organic solvent which has a structure (VI).

15. The composition of claim 2, wherein in said solvent component, said organic solvent component is a single organic solvent having structure (VIf);

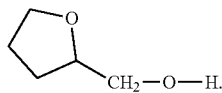

(VIf)

16. The composition of claim 2, wherein in said solvent component, said organic solvent component is a single organic solvent having structure (VIg);

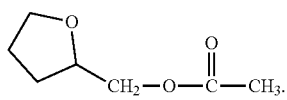

(VIg)

17. The composition of claim 2, wherein in said solvent component, said organic solvent component is a single organic solvent having structure (VII).

18. The composition of claim 2, wherein in said solvent, said organic solvent component is a single organic solvent having structure (VIII).

19. The composition of claim 2, wherein in said solvent, said organic solvent component is a mixture of at least two different organic solvents having structure (IX).

20. The composition of claim 2, wherein in said solvent component, said organic solvent component is a single organic solvent having structure (X).

21. The composition of claim 2, wherein in said solvent component, said organic solvent component is a single organic solvent having structure (XI).

22. The composition of claim 2, wherein in said organic solvent component, said organic solvent component is a mixture of organic solvents, wherein said mixture consists only of a mixture of organic solvent (III) and organic solvent (IV); wherein in said mixture, said organic solvent (III) ranges from about 90 wt % to about 50 wt % of said mixture of organic solvents.

23. The composition of claim 2, wherein in said solvent component the water ranges from about 0 to about 15 wt %.

24. A process comprising the steps;
i) heating the composition of claim 2, at a temperature which is from about room temperature to about 100° C.;
ii) dipping a substrate coated with a patterned photoresist film into said heated composition for a time from about 1 minutes to about 60 minutes, until a dipped substrate, with a removed photoresist film, results;
iii) after dipping step ii), rinsing said dipped substrate with a removed photoresist film with either isopropyl alcohol, water or a mixture of isopropyl alcohol and water to remove any residual composition from dipping step ii), producing a clean substrate;
iv) drying said clean substrate, by either spin drying it in air, or by using a stream of nitrogen or air to dry it.

25. A composition consisting essentially of
a sulfonic acid component selected from the group consisting of camphor sulfonic acid, and a benzene sulfonic acid of structure (I), wherein R is H or a C-1 to C-18 n-alkyl;

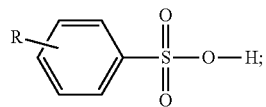

(I)

a dicarboxylic acid having structure (II),

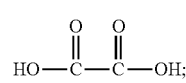

(II)

a solvent component which consists essentially of an organic solvent component, or a mixture of an organic solvent component and water, wherein the organic solvent component consists of about 100 wt % to about 85 wt % of said solvent component, and further wherein said organic solvent component is either selected from the group consisting of solvents (III), (IV), (V), (VI) (wherein R is selected from the group consisting of —(—O—CH$_2$—CH$_2$—)$_{n'}$—OH, —OH, and —O—C(=O)—CH$_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least solvents selected from this group; and further wherein the molar ratio of said sulfonic acid to said dicarboxylic acid is from about 0.01 to about 0.6

Dipropylene glycol monomethyl ether (III),

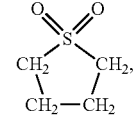

(IV)

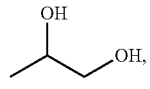

(V)

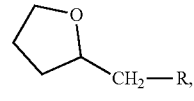

(VI)

(VII)

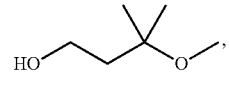

(VIII)

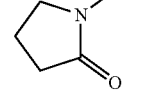

(IX)

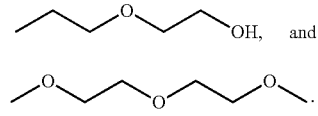

(X)

and (XI)

26. A composition consisting essentially of:
a sulfonic acid component selected from the group consisting of camphor sulfonic acid, and a benzene sulfonic acid of structure (I), wherein R is H or a C-1 to C-18 n-alkyl;

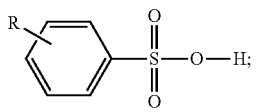 (I)

a dicarboxylic acid having structure (II),

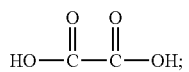 (II)

a solvent component which consists essentially of an organic solvent component, or a mixture of an organic solvent component and water, wherein the organic solvent component consists of about 100 wt % to about 85 wt % of said solvent component, and further wherein said organic solvent component is either selected from the group consisting of solvents (III), (IV), (V), (VI) (wherein R is selected from the group consisting of —(—O—$CH_2$—$CH_2$—)$_{n'}$—OH, —OH, and —O—C(=O)—$CH_3$, wherein n' is equal to 1, 2, 3, or 4), (VII) (wherein Ra is H or a C-1 to C-4 alkyl moiety), (VIII), (IX) (wherein Rb is a C-1 to C-18 alkyl moiety), (X), and (XI) or is a mixture, of at least two organic solvents selected from this group; and further wherein the molar ratio of said sulfonic acid to said dicarboxylic acid is from about 0.01 to about 0.6

Dipropylene glycol monomethyl ether (III),

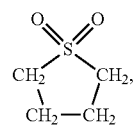 (IV)

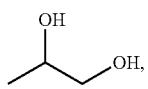 (V)

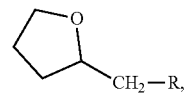 (VI)

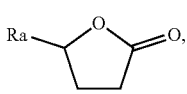 (VII)

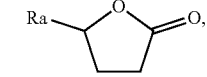 (VIII)

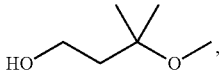 (IX)

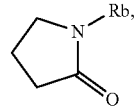 (X)

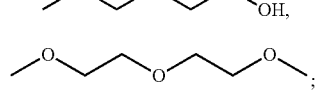 (XI)

and a surfactant.

* * * * *